(12) United States Patent
Hirosaki et al.

(10) Patent No.: US 12,180,402 B2
(45) Date of Patent: Dec. 31, 2024

(54) FLUORESCENT BODY, METHOD FOR MANUFACTURING SAME, AND LIGHT-EMITTING DEVICE USING SAME

(71) Applicant: National Institute for Materials Science, Ibaraki (JP)

(72) Inventors: Naoto Hirosaki, Ibaraki (JP); Takashi Takeda, Ibaraki (JP); Shiro Funahashi, Ibaraki (JP)

(73) Assignee: National Institute for Materials Science, Tsukuba (JP)

( * ) Notice: Subject to any disclaimer, the term of this patent is extended or adjusted under 35 U.S.C. 154(b) by 582 days.

(21) Appl. No.: 17/618,852

(22) PCT Filed: Mar. 31, 2020

(86) PCT No.: PCT/JP2020/014918
§ 371 (c)(1),
(2) Date: Dec. 13, 2021

(87) PCT Pub. No.: WO2020/261691
PCT Pub. Date: Dec. 30, 2020

(65) Prior Publication Data
US 2022/0243126 A1 Aug. 4, 2022

(30) Foreign Application Priority Data
Jun. 27, 2019 (JP) .................................. 2019-119233

(51) Int. Cl.
*C09K 11/59* (2006.01)
*C01F 7/16* (2022.01)
(Continued)

(52) U.S. Cl.
CPC .............. *C09K 11/592* (2013.01); *C01F 7/16* (2013.01); *C01F 7/54* (2013.01); *C01F 11/22* (2013.01);
(Continued)

(58) Field of Classification Search
CPC . C09K 11/592; C01F 7/16; C01F 7/54; C01F 11/22; H01L 33/504; H01L 33/30; H01L 33/32
(Continued)

(56) References Cited

U.S. PATENT DOCUMENTS

| | | |
|---|---|---|
| 2006/0192178 A1 | 8/2006 | Hirosaki |
| 2007/0007494 A1 | 1/2007 | Hirosaki et al. |

(Continued)

FOREIGN PATENT DOCUMENTS

| | | |
|---|---|---|
| JP | 2004-300261 | 10/2004 |
| JP | 3668770 B | 4/2005 |

(Continued)

*Primary Examiner* — Anita Nassiri-Motlagh
(74) *Attorney, Agent, or Firm* — Trojan Law Offices

(57) ABSTRACT

Provided are a new phosphor having emission characteristics different from the conventional nitride or oxynitride phosphor, a manufacturing method, and a light-emitting device. In an embodiment, the phosphor may include inorganic substance having crystal represented by $A_{26}(D, E)_{51}X_{86}$ including at least A, D, X (A is at least one kind of element selected from Mg, Ca, Sr, and Ba; and D is Si, and X is at least one kind of element selected from O, N, and F); and further includes, if necessary, E (E is at least one kind of element selected from B, Al, Ga, and In) wherein the crystal further includes M (M is at least one kind of element selected from Mn, Ce, Pr, Nd, Sm, Eu, Tb, Dy, and Yb). Upon irradiation of excitation source, the maximum value of emission peak in a wavelength range from 630 nm to 850 nm may occur.

16 Claims, 3 Drawing Sheets

(51) Int. Cl.
  *C01F 7/54* (2006.01)
  *C01F 11/22* (2006.01)
  *H01L 23/00* (2006.01)
  *H01L 33/30* (2010.01)
  *H01L 33/32* (2010.01)
  *H01L 33/50* (2010.01)
  *H01L 33/62* (2010.01)

(52) U.S. Cl.
  CPC ............ *H01L 33/504* (2013.01); *H01L 24/45* (2013.01); *H01L 24/48* (2013.01); *H01L 33/30* (2013.01); *H01L 33/32* (2013.01); *H01L 33/62* (2013.01); *H01L 2224/45144* (2013.01); *H01L 2224/48225* (2013.01); *H01L 2224/48245* (2013.01)

(58) Field of Classification Search
  USPC .................................................. 252/301.4 F
  See application file for complete search history.

(56) References Cited

U.S. PATENT DOCUMENTS

| | | |
|---|---|---|
| 2007/0018567 A1 | 1/2007 | Hirosaki |
| 2007/0108896 A1 | 5/2007 | Hirosaki |
| 2009/0129052 A1 | 5/2009 | Hirosaki |
| 2009/0153028 A1 | 6/2009 | Hirosaki et al. |
| 2009/0236969 A1 | 9/2009 | Hirosaki |
| 2011/0121234 A1 | 5/2011 | Hirosaki |
| 2011/0235309 A1 | 9/2011 | Miki et al. |
| 2012/0119234 A1 | 5/2012 | Shioi et al. |
| 2013/0168606 A1 | 7/2013 | Hirosaki et al. |
| 2015/0275082 A1 | 10/2015 | Hirosaki et al. |
| 2017/0204328 A1 | 7/2017 | Yoshimura et al. |
| 2017/0283261 A1 | 10/2017 | Hirosaki et al. |
| 2019/0127638 A1 | 5/2019 | Hirosaki et al. |

FOREIGN PATENT DOCUMENTS

| | | |
|---|---|---|
| JP | 3837551 B | 8/2006 |
| JP | 2009-024038 | 2/2009 |
| JP | 4524368 B | 6/2010 |
| JP | 2017-190434 | 10/2017 |

FLUORESCENT BODY, METHOD FOR MANUFACTURING SAME, AND LIGHT-EMITTING DEVICE USING SAME

TECHNICAL FIELD

The present disclosure relates to phosphors (fluorescent body) having, as a host crystal, $Ba_{26}S_{51}O_2N_{84}$ (hereinafter referred to as the present crystal) and a crystal having the same crystal structure (hereinafter referred to as the present identical crystal) as the present crystal, a method of manufacturing the same, and an application thereof.

BACKGROUND ART

The phosphor is utilized in a fluorescent display tube (VFD: Vacuum-Fluorescent Display), a field emission display (FED: Field Emission Display or SED: Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source as mentioned above, the luminance of the phosphor tends to decrease and a phosphor having little degradation in the brightness is demanded. Therefore, a phosphor having an inorganic crystal containing nitrogen in a crystal structure thereof as a host crystal, instead a phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), calcium oxide (CaO), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Reference 1). It was reported that α-sialon activated with an Eu ion ($Eu^{2+}$) manufactured by the above processes had become a phosphor emitting yellow light in a wavelength range of 550 nm to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (for example, refer to Patent References 2 and 3).

As another example of the sialon phosphor, a green phosphor in which β type sialon is activated by $Eu^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when activated by $Ce^{3+}$ (for example, refer to Patent Reference 6).

As an example of an oxynitride phosphor, a blue phosphor having a JEM phase (JEM; $LaAl(Si_{6-z}Al_z)N_{10-z}O_z$, $0.1 \leq z \leq 3$) as a host crystal, which is activated by Ce (refer to Patent Reference 7), is known. It is known that, in the phosphor, an emission wavelength thereof may shift to a longer wavelength as well as an excitation wavelength thereof may shift to a longer wavelength by substituting part of La with Ca while the crystal structure remains the same.

As another example of the oxynitride phosphor, a blue phosphor having a La—N crystal $La_3Si_8N_{11}O_4$ as a host crystal, which is activated by Ce, is known (refer to Patent Reference 8).

As an example of the nitride phosphor, a red phosphor having a crystal of $CaAlSiN_3$ as a host crystal, which is activated by $Eu^{2+}$, is known (refer to Patent Reference 9). Color rendering properties of a white LED are improved by utilizing this phosphor. A phosphor to which Ce was added as the activating element was reported to be an orange phosphor.

Thus, an emission color of the phosphor is determined by a combination of the crystal to act as the host crystal and a metal ion (activating ion) being incorporated into the crystal as a solid solution. Further, the combination of the host crystal and the activating ion determines emission characteristics such as an emission spectrum and an excitation spectrum, chemical stability, and thermal stability such that a phosphor is regarded as another different phosphor when a host crystal thereof or an activating ion thereof is different. Moreover, a material having a different crystal structure is different in the emission characteristics or in the stability because the host crystal is different even if the material has the same chemical composition such that the material is regarded as another different phosphor.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

From the aforementioned, it is important to find a host crystal having a new crystal structure in developing a new phosphor and it is possible to produce a new phosphor having new emission characteristics by activating such a host crystal with a metal ion causing the host crystal to exhibit luminescence characteristics. Further, it is also possible to produce a crystal having another chemical composition by changing the constituent element while a crystal structure thereof is maintained, thereby producing a phosphor having new emission characteristics.

PRIOR ART REFERENCE

Patent Reference

[Patent Reference 1] Japanese Patent No. 3668770, Specification.
[Patent Reference 2] Japanese Patent No. 3837551, Specification.

[Patent Reference 3] Japanese Patent No. 4524368, Specification.
[Patent Reference 4] Japanese Patent No. 3921545, Specification.
[Patent Reference 5] International Publication No. WO2007/066733.
[Patent Reference 6] International Publication No. WO2006/101096.
[Patent Reference 7] International Publication No. WO2005/019376.
[Patent Reference 8] Japanese Patent Application Publication No. 2005-112922.
[Patent Reference 9] Japanese Patent No. 3837588, Specification.

SUMMARY OF THE INVENTION

Problem to be Solved By the Invention

In an embodiment of the present invention, it is possible to provide a new phosphor having new emission characteristics different from those of the conventional nitride phosphor or oxynitride phosphor, a manufacturing method thereof, and a light-emitting device utilizing the same. In an embodiment of the present invention, it is possible to provide a phosphor emitting light of a red color or near-infrared light upon irradiation of visible light or ultraviolet ray and a manufacturing method thereof.
Further, it is also possible to provide an inorganic phosphor that emits light in a range of a red color and near-infrared range having a wavelength of 630 nm or longer and exhibits high emission intensity even if the phosphor is combined with an LED emitting light having a wavelength of 600 nm or shorter, and a manufacturing method thereof. In an embodiment of the present invention, it is possible to provide a light-emitting device having excellent durability and utilizing such a phosphor.

Means to Solve the Problem

The present inventors, under such a circumstance, have investigated in detail a phosphor having, as a host crystal, a new crystal containing nitrogen and a crystal having a crystal structure thereof in which a metal element or nitrogen element is substituted with another element and found that an inorganic material having the present crystal and the present identical crystal as a host crystal emits fluorescence of high intensity. It has been also found that the phosphor exhibits near-infrared or red color emission with a specific chemical composition.
Further, it has been found that a white color light-emitting diode (light-emitting device) and an illuminating device utilizing the same can be obtained by employing the phosphor wherein the white color includes a component of light in a red or infrared region.
The present inventors conducted an intensive investigation in consideration of the above-mentioned background so as to successfully provide a phosphor rendering emission with a high intensity of a specific wavelength region by implementing configurations as described below.
Further, a phosphor having excellent emission characteristics was successfully manufactured by employing a method described below. Further, there were successfully provided a light-emitting device and an illuminating device, having excellent features by implementing configurations in utilizing the phosphor as described below.

In an embodiment of the present invention, a phosphor may include an inorganic substance having a crystal represented by $A_{26}(D, E)_{51}X_{86}$ that includes at least an A element, a D element, an X element (here, A is at least one kind of element selected from the group consisting of Mg, Ca, Sr, and Ba; and D is Si element, and X is at least one kind of element selected from the group consisting of O, N, and F); and further includes, if necessary, an E element (here, E is at least one kind of element selected from the group consisting of B, Al, Ga, and In) wherein the crystal further includes an M element (here, M is at least one kind of element selected from the group consisting of Mn, Ce, Pr, Nd, Sm, Eu, Tb, Dy, and Yb).
The above-mentioned crystal represented by $A_{26}(D, E)_{51}X_{86}$ may be $A_{26}D_{51}O_2N_{84}$.
The above-mentioned crystal represented by $A_{26}(D, E)_{51}X_{86}$ may have a crystal structure in the cubic crystal system and the lattice constant of a (nm) may satisfy:

$1.6 < a < 1.7$.

The above-mentioned crystal represented by $A_{26}(D, E)_{51}X_{86}$ may be a crystal that belongs to the space group of P-43n (here, "-4" represents 4 overbar (the letter 4 with an overbar) and the 218th space group of the International Tables for Crystallography).
The above-mentioned inorganic substance may have a chemical composition represented by $A_aD_dE_eX_xM_m$ (here, a+d+e+x+m=1) and the parameters a, d, e, x, and m may satisfy the following:

$0.09 \leq a \leq 0.18$, $0.26 \leq d \leq 0.33$, $0 \leq e \leq 0.1$, $0.5 \leq x \leq 0.57$, and $0.0001 \leq m \leq 0.07$.

The above-mentioned parameters a, d, e, x, and m may satisfy the following:

$0.15 \leq a \leq 0.17$, $0.3 \leq d \leq 0.33$, $0 \leq e \leq 0.1$, $0.52 \leq x \leq 0.55$ and $0.0001 \leq m \leq 0.05$.

The above-mentioned crystal represented by $A_{26}(D, E)_{51}X_{86}$ may be $Ba_{26}Si_{51}O_2N_{84}$.
The above-mentioned M may be Eu; the above-mentioned inorganic substance may have a chemical composition represented by $A_aD_dE_eX_xM_m$ (here, a+d+e+x+m=1); and the parameter m of the above-mentioned M may satisfy the following:

$0.0001 \leq m \leq 0.05$.

The phosphor may emit light having a maximum value of an emission peak at a wavelength in a range of 630 nm or longer and 850 nm or shorter as light having a wavelength of 300 nm or longer and 600 nm or shorter is irradiated thereon.
In an embodiment of the present invention, a method of manufacturing the above-mentioned phosphor may include the step of: firing a raw material mixture, which is a mixture of metallic compounds and can constitute the above-mentioned phosphor by firing, in an inert atmosphere including nitrogen in a temperature range that is 1400° C. or higher and is 2200° C. or lower.

The above-mentioned mixture of metallic compounds may include one or more kinds of compounds including A being selected from the group consisting of nitride, oxynitride, oxide, carbonate, and fluoride that include A (here, A is at least one or more kinds of elements selected from the group consisting of Mg, Ca, Sr, and Ba); one or more kinds of compounds including D being selected from the group consisting of nitride, oxynitride, oxide, carbonate, and fluoride that include D (here, D is Si element); if necessary, one or more kinds of compounds including E being selected from the group consisting of nitride, oxynitride, oxide, carbonate, and fluoride that include E (here, E is at least one or more kinds of elements selected from the group consisting of B, Al, Ga, and In); and one or more kinds of compounds including M being selected from the group consisting of nitride, oxynitride, oxide, carbonate, and fluoride that include M (here, M is at least one or more kinds of elements selected from the group consisting of Mn, Ce, Pr, Nd, Sm, Eu, Tb, Dy, and Yb).

In an embodiment of the present invention, the light emitting device may include an excitation source emitting light having a wavelength in a range that is 300 nm or longer and is 600 nm or shorter and at least one of the above-mentioned phosphors.

The above-mentioned excitation source may be a light-emitting diode (LED) or a laser diode (LD).

There may be further included by the light emitting device one or more kinds of phosphors emitting light having a maximum value of an emission peak at a wavelength in a range that is 400 nm or longer and 760 nm or shorter by irradiating light from the above-mentioned excitation source.

The above-mentioned one or more kinds of phosphors may be one or more kinds of phosphors selected from the group consisting of AlN: (Eu, Si), $BaMgAl_{10}O_{17}$:Eu, $SrSi_9Al_{19}ON_{31}$:Eu, $LaSi_3Al_{19}N_{32}$:Eu, α-sialon:Ce, JEM: Ce, β-sialon:Eu, (Ba, Sr, Ca, Mg)$_2SiO_4$:Eu, (Ca, Sr, Ba)$Si_2O_2N_2$:Eu, YAG:Ce, α-sialon:Eu, $CaAlSiN_3$:Ce, $La_3Si_6N_{11}$:Ce, $CaAlSiN_3$:Eu, (Ca, Sr)$AlSiN_3$:Eu, $Ca_2Si_5N_8$:Eu, and $Sr_2Si_5N_8$:Eu.

The above-mentioned light emitting device may be any one of an illuminating device, a backlight emission source for a liquid crystal panel, a lamp for a projector, an infrared lighting device, or a light source for an infrared measuring device.

Effect of the Invention

In an embodiment of the present invention, a phosphor may include inorganic substance including as a main component the present crystal or the present identical crystal. The inorganic substance can work as a phosphor and, if having a specific chemical composition, can emit light of a red color or near-infrared light by the irradiation of visible light or an ultraviolet ray. With respect to this phosphor, it is not likely that the emission intensity would be reduced even if exposed to the excitation source. A useful phosphor is provided where the phosphor is suitably utilized in a light emitting device such as a white color light-emitting diode, an illuminating device, a backlight emission source for a liquid crystal display, a lamp for a projector, an infrared lighting device, a light source for an infrared measuring device.

EMBODIMENT FOR CARRYING OUT THE INVENTION

Hereafter, in an embodiment of present invention, a phosphor is described in detail.

In an embodiment of the present invention, a phosphor includes inorganic substance including at least an A element, a D element, and an X element, and, if necessary, an E element (where A is at least one or more kinds of elements selected from the group consisting of Mg, Ca, Sr, and Ba; D is Si element; X is at least one or more kinds of elements selected from the group consisting of O, N, and F; E is at least one or more kinds of elements selected from the group consisting of B, Al, Ga, and In) wherein the inorganic substance includes the present crystal represented by $Ba_{26}Si_{51}O_2N_{84}$, the present identical crystal represented by $A_{26}(D, E)_{51}X_{86}$, or the present identical crystal having another chemical composition as the host crystal and includes an M element (where M is at least one or more kinds of elements selected from the group consisting of Mn, Ce, Pr, Nd, Sm, Eu, Tb, Dy, and Yb) as the emitting element.

The crystal represented by $Ba_{26}Si_{51}O_2N_{84}$ is what the present inventors newly synthesized and confirmed to be a new crystal by the crystal structure analysis and has not been reported before filing the present application as far as the present inventors know.

Figure 1:
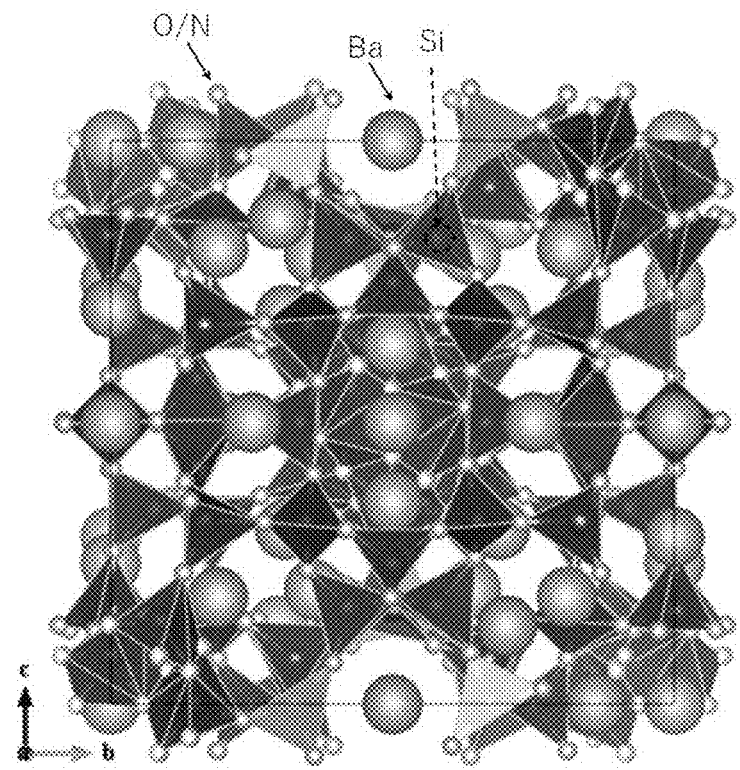
FIG. 1 shows a diagram illustrating a crystal structure of the present crystal.

FIG. 1 shows a diagram illustrating a crystal structure of $Ba_{26}Si_{51}O_2N_{84}$ crystal.

As a result of the single crystal structure analysis of the $Ba_{26}Si_{51}O_2N_{84}$ the present inventors synthesized in Example 1, it has been found that the present crystal belongs to the cubic crystal system and belongs to the P-43n space group ("-4" represents 4 overbar; the 218th space group of the International Tables for Crystallography) and has the crystal structure parameters and atomic coordinate positions as shown in Table 1. In Table 1, lattice constants a, b, and c signify respective lengths of the axes of the unit cell, and α, β, and γ signify respective angles between axes of the unit cell. The atomic coordinates indicate a position of each atom in the unit cell in terms of a value between 0 and 1 using the unit cell as a unit. According to the analysis results thus obtained, there were atoms of Ba, Si, O, and N, respectively and Ba existed in five (5) kinds of sites: (Ba1 to Ba5). Also, according to the analysis results thus obtained, Si existed in three (3) kinds of sites: (Si1 to Si5). Further, according to the analysis results thus obtained, N and O existed in nine kinds of sites: (X1 to X9) without any distinction in the kind.

TABLE 1

Crystal structure parameters of $Ba_{26}Si_{51}O_2N_{84}$ crystal

| Crystal composition | | $Ba_{26}Si_{51}O_2N_{84}$ | |
|---|---|---|---|
| Formula weight (Z) | | 2 | |
| Crystal system | | Cubic structure | |
| Space group | | $P\bar{4}3n$ | |
| Space group number | | 218 | |
| Lattice constants | a | 1.65209(6) | nm |
| | b | 1.65209(6) | nm |
| | c | 1.65209(6) | nm |
| | α | 90 | Degree |
| | β | 90 | Degree |
| | γ | 90 | Degree |

| | Atomic coordinates | | | Site occupancy |
|---|---|---|---|---|
| Atoms | x | y | z | rate |
| Ba(1) | 0.25 | 0.5 | 0 | 1 |
| Ba(2) | 0.296838(13) | 0.139201(12) | 0.00016(7) | 1 |
| Ba(3) | 0.5 | 0 | 0 | 1 |
| Ba(4) | 0.19068(6) | 0.19068(6) | 0.19068(6) | 1 |
| Ba(5) | 0.81016(6) | 0.18984(6) | 0.18984(6) | 1 |
| Si(1) | 0.08809(5) | 0.14776(5) | −0.0010(2) | 1 |
| Si(2) | 0.5 | 0.25 | 0 | 1 |
| Si(3) | 0.16579(5) | 0.32671(5) | 0.0000(3) | 1 |
| Si(4) | 0.3487(2) | 0.3280(2) | 0.0787(2) | 1 |
| Si(5) | 0.34693(19) | 0.3265(2) | −0.0783(2) | 1 |
| X(1) | 0.27223(16) | 0.32326(15) | −0.0043(5) | 1 |
| X(2) | 0.41776(16) | 0.31018(16) | −0.0026(6) | 1 |
| X(3) | 0.3596(3) | 0.5916(3) | 0.1386(3) | 1 |
| X(4) | 0.1301(3) | 0.7664(3) | −0.0277(3) | 1 |
| X(5) | 0.3494(3) | 0.2393(3) | −0.1469(3) | 1 |
| X(6) | 0.1411(3) | 0.0593(3) | −0.0009(15) | 0.5 |
| X(7) | 0.3682(2) | 0.4264(2) | 0.1053(2) | 1 |
| X(8) | 0.0860(4) | 0.0860(4) | 0.0860(4) | 0.5 |
| X(9) | 0.1626(5) | 0.1011(5) | −0.0601(5) | 0.5 |

According to the analysis result using the data of Table 1, it has been found that the present crystal has a crystal structure as shown in FIG. 1 where Ba element is contained in the skeleton composed of a series of tetrahedrons constituted of bonds between Si and O or Si and N. The M element to become an activating ion such as Eu in the crystal is incorporated into the crystal by partially substituting Ba element mainly.

As one of the present identical crystal, there is cited $A_{26}(D, E)_{51}X_{86}$. As a typical example, A includes at least one or more kinds of elements selected from the group consisting of Mg, Ca, Sr, and Ba. As a typical example, D is Si element. As a typical example, E includes at least one or more kinds of elements selected from the group consisting of B, Al, Ga, and In. As a typical example, X includes at least one or more kinds of elements selected from the group consisting of O, N, and F. Here, it is desirable that the condition where the electrical neutrality of cations of A, D, and E and anions of X is maintained is satisfied.

The crystal structure of the present crystal can be identified by the X-ray diffraction analysis and the neutron diffraction analysis. With respect to the crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In an embodiment of the present invention, a crystal structure is defined to be identical to that of the present crystal if lengths of chemical bonds (distance of neighboring atoms) of Al—N and Si—N calculated from the lattice constants and atomic coordinates obtained by conducting the Rietveld analysis of the results from the X-ray diffraction or the neutron diffraction in the space group of P-43n ("-4" represents 4 overbar) are compared with lengths of chemical bonds calculated from the lattice constants and atomic coordinates of the present crystal as shown in Table 1 such that the difference between the lengths is within ±5%, and using the definition it is determined whether the crystal having the crystal structure belongs to the system of the present crystal or not. This determination criterion is employed herein since it was once observed that a crystal changed to another crystal due to breakage of chemical bonds when lengths of the chemical bonds were changed beyond ±5% according to the prior experiments.

Further, in case an amount of solid-solution is small, a simple method for determining whether it belongs to the present crystal or the present identical crystal or not is described as follows. A new substance can be identified to have the same (identical) crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
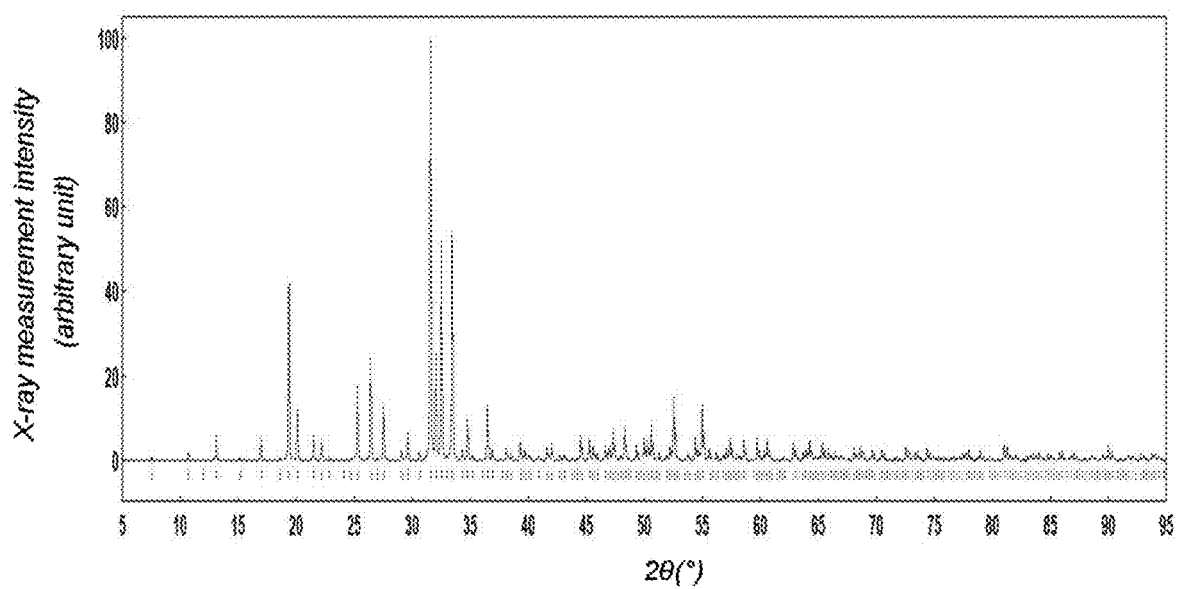
FIG. 2 shows a diagram illustrating a powder X-ray diffraction pattern with the Cu Kα line calculated from the crystal structure of the present crystal.

FIG. 2 shows a diagram illustrating a powder X-ray diffraction pattern with the Cu Kα line calculated from the crystal structure of the present crystal.

By comparing the pattern of FIG. 2 with that of the substance to be compared, it can be judged and determined whether the substance has the same crystal structure as the present crystal or the present identical crystal in a simple manner. It may be good to make a judgment using approximately ten (10) peaks of the highest intensity in the diffraction pattern as the main peaks of the present crystal. Table 1 is important in this sense since it could be referenced when the identification of the present crystal is conducted. Further, it is also possible to define a crystal structure of the present crystal as an approximate structure using another crystal system of the cubic crystal and, in such a case, the crystal structure is expressed using a different space group, different lattice constants, and different plane indices, but the X-ray diffraction results (for example, FIG. 2) and the crystal structure (for example, FIG. 1) remain unchanged such that an identification method and an identification result thereof are the same. Therefore, in an embodiment of the present invention, it is to perform an X-ray diffraction analysis using the cubic system.

If the present crystal or the present identical crystal is activated by at least one kind of element selected from the group consisting of Mn, Ce, Pr, Nd, Sm, Eu, Tb, Dy, Ho, Er, Tm, and Yb as the M element, there would be obtained a phosphor. Since emission characteristics such as an excitation wavelength, an emission wavelength, and emission intensity may vary depending on the composition of the crystal and the kind and quantity of the activating element, such conditions may be chosen in accordance with an application thereof. The present crystal phosphor activated by M may be represented by the composition of $(Ba, M)_{26}Si_{51}O_2N_{84}$. The present identical crystal phosphor activated by M may be represented by the composition of $(A, M)_{26}(D, E)_{51}X_{86}$.

In the crystal represented by $A_{26}(D, E)_{51}X_{86}$, a phosphor having the $A_{26}D_{51}O_2N_{84}$ crystal as the host crystal may in particular exhibit high emission intensity.

A phosphor including an inorganic substance that is represented by $A_{26}(D, E)_{51}X_{86}$ and is a cubic crystal where the lattice constant a (nm) satisfies:

1.6<a (lattice constant)<1.7 and wherein the inorganic substance is activated by an emitting ion exhibits high emission intensity. Here, the phosphor activated by Eu is represented by the composition of (A, Eu)$_{26}$(D, E)$_{51}$X$_{86}$. The phosphor including a crystal having a (lattice constant) of a (lattice constant)=1.65209(6) nm in particular exhibits the highest emission intensity. Since the crystal is a cubic crystal, other parameters describing the crystal lattice satisfy a (lattice constant)=b=c and α=β=γ=90°.

A phosphor including a crystal that is represented by A$_{26}$(D, E)$_{51}$X$_{86}$ and belongs to the space group of P-43n ("-4" represents 4 overbar and the 218th space group of the International Tables for Crystallography) as the host crystal exhibits high emission intensity.

A phosphor having a chemical composition represented by A$_a$D$_d$E$_e$X$_x$M$_m$ (here, a+d+e+x+m=1) wherein the parameters a, d, e, x, and m satisfy:

$0.09 \leq a \leq 0.18$, $0.26 = d \leq 0.33$, $0 \leq e \leq 0.1$, $0.5 \leq x \leq 0.57$, and $0.0001 \leq m \leq 0.07$, exhibits high emission intensity.

The parameter a is a parameter representing a composition of the A element and the crystal structure is stable in this range. The parameter d is a parameter representing a composition of the D element and the crystal structure is stable in this range. The parameter e is a parameter representing a composition of the E element, which may be 0, but in the case where it is 0.1 or less the crystal structure could be stable in this range. The parameter x is a parameter representing a composition of the X element and the crystal structure is stable in this range. The parameter m is a parameter representing a composition of the non-activating M element and an amount of the emitting ion is sufficient in this range and the reduction of emission intensity due to the concentration quenching may not occur. The X element is an anion such that the composition may be determined as the charge neutrality is maintained with the cations of the A, D, E, and M elements.

A phosphor where the parameters a, d, e, x, and m preferably satisfy:

$0.15 \leq a \leq 0.17$, $0.3 \leq d \leq 0.33$, $0 \leq e \leq 0.1$, $0.52 \leq x \leq 0.55$, and $0.0001 \leq m \leq 0.05$, exhibits further high emission intensity.

In the above-mentioned composition formula, a phosphor including an inorganic substance where the X element includes N and, if necessary, O and the composition formula of A$_a$D$_d$E$_e$O$_{x1}$N$_{x2}$M$_m$ (here, a+d+e+x1+x2+m=1 and x1+x2=x) represents the inorganic substance wherein the parameters satisfy:

$0 \leq x1 \leq 0.08$, $0.45 \leq x2 \leq 0.53$, and $0.5 \leq x \leq 0.57$, exhibits excellent fluorescence property.

A phosphor including an inorganic substance where the parameters more preferably satisfy:

$0.01 \leq x1 \leq 0.03$, $0.5 \leq x2 \leq 0.52$, and $0.52 \leq x \leq 0.55$, exhibits excellent fluorescence property. If the atomic ratio of N to O included by the inorganic substance is in this range, the crystal structure is stable and high emission intensity is achieved.

A phosphor in which a crystal represented by A$_{26}$(D, E)$_{51}$X$_{86}$ has the crystal of Ba$_{26}$Si$_{51}$O$_2$N$_{84}$ as the host crystal exhibits high emission intensity. In this case, the phosphor activated by Eu is represented by (Ba, Eu)$_{26}$Si$_{51}$O$_2$N$_{84}$.

As one embodiment of the present invention, there is a phosphor having the composition represented by A$_a$D$_d$E$_e$X$_x$M$_m$ (here, a+d+e+x+m=1) where M is Eu and the content m satisfies $0.0001 \leq m \leq 0.05$. This phosphor exhibits an emission peak of the maximum value in the range that is 630 nm or longer and 850 nm or shorter upon irradiation of light having any wavelength that is 300 nm or longer and 600 nm or shorter so as to be suitable for such an application of the phosphor. By adjusting the composition, in an embodiment of the present invention, a phosphor may emit light having an emission peak at a wavelength that is 750 nm or longer and 810 nm or shorter upon irradiation of light having any wavelength that is 300 nm or longer and 600 nm or shorter.

A phosphor in which inorganic substance includes single crystal particles or an aggregate of the single crystals having a mean particle diameter of 0.1 μm or more to 20 μm or less has high emission efficiency and a good handling property when it is applied to an LED such that it is good to control the particle diameter thereof in this range.

Impurity elements of Fe, Co, and Ni included in the inorganic substance may cause the emission intensity to decrease. If the sum of these impurity elements in the phosphor is controlled to be 500 ppm or less, an influence of these elements on the emission intensity is decreased.

As one of the embodiments of the present invention, there is a phosphor having at least 20 mass % of content amount of phosphor having the present crystal or the present identical crystal as the host crystal, which is comprised of a mixture of the phosphor having the present crystal or the present identical crystal as the host crystal and another crystal phase or an amorphous phase. It may be good to employ this embodiment in the case where the target property may not be achieved by only the phosphor having the present crystal or the present identical crystal as the host crystal and a feature such as electric conductivity is acquired additionally. The content amount of the phosphor having the present crystal or the present identical crystal as the host crystal may be adjusted according to the target property, but if it is 20 mass % or less, the emission intensity may be decreased.

As the inorganic substance having the electrical conductivity, oxide, oxynitride, nitride, or a combination thereof of one or two or more kinds of elements selected from Zn, Al, Ga, In, and Sn may be named. For example, zinc oxide, aluminum nitride, indium nitride, tin oxide, and so on may be named.

If the target emission spectrum cannot be achieved by only the phosphor itself having the present crystal or the present identical crystal, another phosphor may be added. As the other phosphor, there may be cited BAM (BaMgAl$_{10}$O$_{17}$) phosphor activated by Eu or Ce, β-sialon phosphor, α-sialon, (Sr, Ba)$_2$Si$_5$N$_8$ phosphor, CaAlSiN$_3$ phosphor, (Ca, Sr)AlSiN$_3$ phosphor, and so on.

In such an embodiment of the present invention, it is not necessary to stipulate the manufacturing method of the phosphor, but the phosphor may be obtained by firing a raw material mixture in an inert atmosphere containing nitrogen in a temperature range that is 1400° C. or higher and 2200° C. or lower, wherein the raw material mixture may constitute a phosphor having the present crystal or the present identical crystal by firing, for example, the mixture including metal compounds. In an embodiment of the present invention, the crystal of the phosphor is in the cubit system and belongs to the space group of P-43n ("-4" represents 4 overbar), but, depending on the synthesis condition such as a firing temperature, another crystal in a different crystal system or belonging to a different space group may be mixed and even in such a case, the emission characteristics of the phosphor may change only slightly such that the phosphor can be used as a high emission intensity phosphor.

As a starting material, for example, a mixture of metal compounds, which comprises a compound including M, a compound including A, and a compound including D, and, if necessary, a compound including E, and a compound including X (here, M is one or more kinds of elements selected from the group consisting of Mn, Ce, Pr, Nd, Sm, Eu, Tb, Dy, and Yb; A is one or more kinds of elements selected from the group consisting of Mg, Ca, Sr, and Ba; D is Si element; E is one or more kinds of elements selected from the group consisting of B, Al, Ga, and In; and X is one or more kinds of elements selected from the group consisting of O, N, and F), may be satisfactorily utilized.

As the starting raw material, the compound including M that is a single kind of substance or a mixture of at least two kinds of substances selected from the group consisting of metal, silicide, oxide, carbonate, nitride, oxynitride, chloride, fluoride and oxyfluoride, each of which includes M; the compound including A that is a single kind of substance or a mixture of at least two kinds of substances selected from the group consisting of metal, silicide, oxide, carbonate, nitride, oxynitride, chloride, fluoride, and oxyfluoride, each of which includes A; the compound including D that is a single kind of substance or a mixture of at least two kinds of substances selected from the group consisting of metal, silicide, oxide, carbonate, nitride, oxynitride, chloride, fluoride, and oxyfluoride, each of which includes D; and the compound including E that is a single kind of substance or a mixture of at least two kinds of substances selected from the group consisting of metal, silicide, oxide, carbonate, nitride, oxynitride, chloride, fluoride, and oxyfluoride, each of which includes E are desirable because they are easily available and have excellent stability. The compound including X that is a single substance or a mixture of at least two kinds of substances selected from the group consisting of oxide, nitride, oxynitride, fluoride, and oxyfluoride is desirable because the raw material is easily available and has excellent stability. Here, in the case where a compound including M, A, D, and E is a compound that includes X as a target, the compound including X may be the common compound that includes M, A, D, or E.

As the starting raw material, for example, a mixture of any of nitride, oxynitride, oxide, carbonate, and fluoride of the A element, the D element, the M element, and, if necessary, the E element may be satisfactorily utilized.

In the case where a phosphor of Ba$_{26}$Si$_{51}$O$_2$N$_{84}$ activated by Eu is manufactured, it is preferable to utilize a mixture raw material including at least nitride or oxide of europium; nitride or oxide or carbonate of barium; silicon oxide or silicon nitride since the reaction tends to easily proceed during the firing.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing.

The firing temperature may be 1400° C. or higher and 2200° C. or lower. If the temperature is lower than 1400° C., the reaction may not proceed sufficiently. If the temperature is higher than 2200° C., the raw material powder or the synthesized compound may be decomposed. The firing time depends on the firing temperature, but it is usually one or more hours and 48 hours or less.

The nitrogen-containing inert atmosphere in the pressure range of 0.1 MPa or more to 100 MPa or less is preferable because thermal decomposition of nitride or oxynitride of the starting raw material or the product is suppressed. It is preferable that the oxygen partial pressure is 0.0001% or lower in the firing atmosphere in order to suppress the oxidation reaction of nitride or oxynitride of the starting raw material or the product.

In order to manufacture the phosphor in the form of powder or aggregate, it would be preferable to utilize a method of firing raw materials after the raw materials are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material.

Although various kinds of heat-resistant materials can be used for the container containing the raw material compound in firing the raw material mixture, in view of a low adverse effect of material deterioration on the metal nitride used in the embodiment of present invention, a material suitably includes a boron nitride coated container, which is exemplified by a boron nitride coated graphite crucible used for synthesis of an α-sialon as described in a scientific journal "Journal of the American Ceramic Society" Vol. 85, No. 5, pages 1229 to 1234 in 2002, or a boron nitride sintered body. When the firing is performed under such conditions, boron or boron nitride component may be mixed into the product from the container, but, if the amount thereof is small, an effect of mixing is slight since the emission characteristics are not deteriorated. Further, durability of the product may be occasionally improved by the addition of a small amount of boron nitride thereto, and such addition may be preferable in some cases.

In order to manufacture the phosphor in the form of powder or aggregate, it is preferable to make the mean particle diameter of powder particles or aggregate of the raw material equal to or less than 500 μm since the raw material has excellent reactivity and handling characteristics.

As a method of adjusting a particle size of the particles or aggregates to be 500 μm or less, it is preferable to employ a spray dryer, sieving, or pneumatic classification since such a method has excellent operating efficiency and handling characteristics.

As a method of firing, not the hot-pressing, but a method of firing, in which no external mechanical pressing is applied, such as pressureless sintering method and gas pressure sintering method is preferable as a method of obtaining a product of powder or aggregate.

A mean particle diameter of phosphor powder is preferably 50 nm or more and 200 μm or less in terms of a volume-based median diameter (d50) because the emission intensity is high. The volume-based mean particle diameter can be measured, for example, by a Microtrac or a laser light scattering method. A mean particle diameter of phosphor powder synthesized by firing may be satisfactorily adjusted to be at least 50 nm and not exceeding 200 μm by applying at least one technique selected from pulverization, classification, and acid treatment.

Defects included in the powder and damages caused by pulverization may be occasionally cured by heat-treating the phosphor powder after firing, the phosphor powder after pulverizing treatment, or the phosphor powder after controlling a particle size at a temperature of 1,000° C. or higher to the firing temperature or lower. The defects and damages may occasionally cause a decrease in the emission intensity, and in such a case, the emission intensity may be recovered by the heat treatment.

During firing for synthesis of the phosphor, a stable crystal may be occasionally obtained by adding an inorganic substance forming a liquid phase at a temperature of a firing temperature or lower and firing a mixture thereof such that the liquid phase acts as a flux to promote the reaction and particle growth, and thus the emission intensity may be occasionally improved.

Specific examples of the inorganic substance forming the liquid phase at the temperature of the firing temperature or lower include a single substance or a mixture of two or more kinds of fluoride, chloride, iodide, bromide, or phosphate of one or two or more kinds of elements selected from the group consisting of Li, Na, K, Mg, Ca, Sr, and Ba. The inorganic substance have different melting points, respectively, and therefore may be satisfactorily used properly depending on a synthesizing temperature.

Further, the emission intensity of the phosphor may occasionally become high by reducing the content amount of the inorganic substance forming the liquid phase at the temperature of the firing temperature or lower by washing the phosphor with a solvent after the firing.

When the phosphor of the embodiment of present invention is used in an application of a light-emitting device or the like, it is preferable to use the phosphor dispersed in a liquid medium. And the phosphor can be used as the phosphor mixture including the phosphor of the embodiment of present invention. A composition prepared by dispersing the phosphor of the embodiment of present invention in the liquid medium is referred to as a phosphor-containing composition.

In the embodiment of the present invention, any kind of liquid medium can be selected for the use as the usable medium for the phosphor-containing composition in accordance with the purpose of application as long as it can disperse suitably the phosphor and would not cause an undesirable reaction or the like in the embodiment of the present invention. As an example of the medium or media, there are provided glass, silicone resin, epoxy resin, polyvinyl resin, polyethylene resin, polypropylene resin, polyester resin and the like. With respect to the media, a single kind of liquid medium may be used by itself, or any combination of two or more kinds of liquid media with any combination ratio thereof may be used.

An amount of used liquid medium or media may be appropriately adjusted depending on an application or the like, but, in general, the amount is in the range of usually 3 wt % or more and preferably 5 wt % or more, to usually 30 wt % or less and preferably 15 wt % or less in terms of the weight ratio of the phosphor to the liquid medium or media.

In an embodiment of the present invention, a light-emitting device is configured with at least an excitation source (emission source) and the phosphor of an embodiment the present invention. As the emission source, there are a light-emitting diode (LED), a laser diode (LD), a fluorescent lamp, and so on. The LED, in an embodiment of the present invention, can be manufactured using the phosphor and by the publicly known method, which is described in Japanese Patent Application Publication No. H05(1993)-152609, Japanese Patent Application Publication No. H07 (1995)-99345, Japanese Patent No. 2927279, and the like. In such a case, the light-emitting body or the emission source is preferably what emits light having a wavelength that is 300 nm or longer and 600 nm or shorter, and an ultraviolet (or violet) LED light-emitting element emitting light having a wavelength that is 300 nm or longer and 420 nm or shorter, a blue LED light-emitting element emitting light having a wavelength that is 420 nm or longer and 500 nm or shorter, a green, yellow, or red LED light-emitting element emitting light having a wavelength that is 500 nm or longer and 600 nm or shorter, and the like can be used. As such LEDs, there is what is configured with a semiconductor such as GaN, InGaN, and AlGaAs and it could be an emission source emitting light having a predetermined wavelength by adjusting the composition.

In an embodiment of the present invention, as one example of the light-emitting device, a single phosphor or plural phosphors emitting fluorescence having the maximum value (peak) at a wavelength in the range that is 400 nm or longer and 760 nm or shorter upon irradiation of light emitting light having any wavelength that is 300 nm or longer and 600 nm or shorter can be included in addition to the phosphor of the embodiment of the present invention. In this way, a light-emitting device emitting light including color components of a violet color component of 400 nm, a blue color component, a green color component, a yellow color component, a red color component, and an infrared color component can be configured.

In an embodiment of the present invention, as one example of the light-emitting device, a blue color phosphor emitting light having a wavelength that is 400 nm or longer and 500 nm or shorter upon irradiation of the light-emitting body or the emission source can be included in addition to the phosphor of the embodiment of the present invention. As such phosphors, there are AlN:(Eu, Si), $BaMgAl_{10}O_{17}$:Eu, $SrSi_9Al_{19}ON_{31}$:Eu, $LaSi_9Al_{19}N_{32}$:Eu, α-sialon:Ce, JEM:Ce and the like. In the specification of the present application, the expression of "inorganic substance: non-activating element" is used to mean a phosphor in which a predetermined inorganic substance is activated by a non-activating element and, by way of example, the expression of "AlN:(Eu, Si)" signifies a phosphor in which the AlN host crystal is activated by Eu and/or Si.

In an embodiment of the present invention, as one example of the light-emitting device, a green phosphor emitting light having a peak wavelength that is 500 nm or longer and 550 nm or shorter upon irradiation of the light-emitting body or the emission source can be included in addition to the phosphor of the embodiment of the present invention. As examples of such a green phosphor, there are β-sialon:Eu, (Ba, Sr, Ca, Mg)$_2$SiO$_4$:Eu, (Ca, Sr, Ba)$Si_2O_2N_2$:Eu, and so on.

In the embodiment of the present invention, as one example of the light-emitting device, a yellow phosphor emitting light having a peak wavelength that is 550 nm or longer and 600 nm or shorter upon irradiation of the light-emitting body or the emission source can be included in addition to the phosphor of the embodiment of the present invention. As examples of such a yellow phosphor, there are YAG:Ce, α-sialon:Eu, CaAlSiN$_3$:Ce, La$_3$Si$_6$N$_{11}$:Ce, and so on.

In the embodiment of the present invention, as one example of the light-emitting device, a red phosphor emitting light having a peak wavelength that is 600 nm or longer and 700 nm or shorter upon irradiation of the light-emitting body or the emission source can be included in addition to the phosphor of the embodiment of the present invention. As examples of such a red phosphor, there are CaAlSiN$_3$:Eu, (Ca, Sr)AlSiN$_3$:Eu, Ca$_2$Si$_5$N$_8$:Eu, Sr$_2$Si$_5$N$_8$:Eu, and so on.

In an embodiment of the present invention, as one example of the light-emitting device, a highly-efficient light-emitting device can be configured by employing a LED in which a light-emitting body or an emission source emits light having a wavelength that is 320 nm or longer and 500 nm or shorter due to the high emission efficiency.

In an embodiment of the present invention, the light-emitting device can include an illuminating device, a backlight emission source for a liquid crystal panel, a lamp for a projector, an infrared lighting device, and a light source for an infrared measuring device. In an embodiment of the present invention, it is confirmed that a phosphor may emit light upon excitation by an electron beam, a vacuum ultraviolet ray of 100 nm or longer and 190 nm or shorter, an ultraviolet ray of 190 nm or longer and 380 nm or shorter, visible light of 380 nm or longer and 600 nm or shorter, and the like and a light-emitting device as mentioned above can be configured by combining these excitation sources and phosphors of the embodiment of the present invention.

In an embodiment of the present invention in which an inorganic substance including a crystal phase having a specific chemical composition is included, a phosphor thereof has a white object color so as to be used as a pigment or a fluorescent pigment. That is, in the embodiment of the present invention, the white object color is observed if illumination light such as sunlight and fluorescent light is irradiated on the phosphor and coloration thereof is excellent and does not deteriorate for a long time such that, in the embodiment of the present invention, the phosphor is suitable for an inorganic pigment. Therefore, when the phosphor is used for a paint, ink, color, glaze, colorant to be added to a plastic product or the like, a favorable coloring can be maintained at a high level for a long period of time.

In an embodiment of the present invention, the phosphor absorbs an ultraviolet ray so as to be suitable as an ultraviolet absorber. Thus, when the phosphor is used as the paint or applied onto a surface of the plastic product or kneaded into an inside thereof, a shielding effect thereof against the ultraviolet ray is so high that the product may be effectively protected from the ultraviolet degradation.

In an embodiment of the present invention, the light-emitting device includes a white light-emitting diode, a red light-emitting diode, a diode emitting white light and infra-red light, or an illuminating device including a plurality of these diodes, a backlight for a liquid crystal panel, and so on.

In an embodiment of the present invention, explanation will be made in detail by way of examples as shown below, but these are disclosed only for the purpose of facilitating understanding the embodiment of the present invention readily such that the present invention and embodiments thereof are not limited to these examples.

EXAMPLES

[Structure Analysis of Ba$_{26}$Si$_{51}$O$_2$N$_{84}$ Crystal (Present Crystal)]

A Ba$_{26}$Si$_{51}$O$_2$N$_{84}$ crystal was synthesized and the crystal structure thereof was analyzed. The raw material powders used for the synthesis were: silicon nitride powder with a particle size of specific surface area of 11.2 m$^2$/g, oxygen content of 1.29 wt %, and a type content of 95% (SN-E10 grade made by Ube Industries, Ltd.); silicon dioxide powder (SiO$_2$; made by Kojundo Chemical Laboratory Co., Ltd.); and barium nitride powder with purity of 99.7% (Ba$_3$N$_2$; made by Materion).

A mixture composition was designed such that barium nitride (Ba$_3$N$_2$), silicon nitride (Si$_3$N$_4$), and silicon oxide (SiO$_2$) will constitute the composition of Ba$_{26}$Si$_{51}$O$_2$N$_{84}$. These raw material powders were weighed to make the above mixture composition and the mixture raw material powders were mixed for 5 minutes using a pestle and a mortar made of silicon nitride sintered body in a nitrogen atmosphere including oxygen content of 1 ppm in a glove-box. Next, the thus-obtained powder mixture was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of 1×10$^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 2000° C. at a rate of 500° C. per hour, and then the temperature was maintained for two (2) hours.

A synthesized compound was observed by means of an optical microscope and a crystal particle having a size of 10 μm was collected out of the synthesized compound. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Ba and Si elements was confirmed, and it was confirmed that the composition was the same as designed.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

Next, the crystal structure of the crystal was determined using single crystal structure analysis software (APEX2 made by Bruker AXS Inc.) from the results of X-ray diffraction measurement. The crystal structure data thus-obtained are shown in Table 1, and a diagram of the crystal structure is shown in FIG. 1. The crystal system, the space group, the lattice constants, and the kinds and positions of atoms are described in Table 1, and the shape and the size of the unit cell and the arrangement of atoms therein can be determined using the data.

It was found that the crystal belonged to the cubic system, and belonged to the space group P-43n ("–4" represents 4 overbar; the 218th space group of the International Tables for Crystallography), and the lattice constants: a=b=c=1.65209 and the angles $\alpha=\beta=\gamma=90°$ were determined. Further, the atom positions were determined as shown in Table 1. Here, O and N exist in the equivalent atom positions with a certain ratio, which should be determined by condition of electrical neutrality. The composition of the crystal obtained from the single crystal X-ray structure analysis was $Ba_{26}Si_{51}O_2N_{84}$.

From the crystal structure data, it was confirmed that the crystal was a new substance having not been reported so far. A powder X-ray diffraction pattern calculated from the crystal structure data is shown in FIG. 2. Hereafter, it is possible to determine the formation of the crystal $Ba_{26}Si_{51}O_2N_{84}$ by performing a powder X-ray diffraction measurement of the synthesized compound and comparing the measured powder X-ray diffraction pattern with that of FIG. 2 to find they are the same. Further, since the powder X-ray pattern can be calculated from values of the lattice constants obtained from the powder X-ray diffraction measurement and the crystal structure data of Table 1 with respect to what retains the same crystal structure and has the varied lattice constants, the formation of the present crystal can be judged by comparing the measured pattern with the calculated pattern.

Example 1: Phosphor

Next, a phosphor having $Ba_{26}Si_{51}O_2N_{84}$ as a host crystal was synthesized. The raw material powders used for the synthesis were: silicon nitride powder with a particle size of specific surface area of 11.2 m²/g, oxygen content of 1.29 wt %, and a type content of 95% (SN-E10 grade made by Ube Industries, Ltd.); silicon dioxide powder ($SiO_2$; made by Kojundo Chemical Laboratory Co., Ltd.); barium nitride powder with purity of 99.7% ($Ba_3N_2$; made by Materion); and europium nitride (EuN; what was obtained by nitriding metal europium as the metal europium was heated in an ammonia gas flow at 800° C. for ten (10) hours).

A mixture composition was designed such that barium nitride ($Ba_3N_2$), silicon nitride ($Si_3N_4$), silicon oxide ($SiO_2$), and europium nitride (EuN) will constitute the composition of $(Ba, Eu)_{26}Si_{51}O_2N_{84}$. The ratio between Ba and Eu was designed as Eu/(Ba+Eu)=0.005. The raw material powders were weighed to make the mole ratios of $Ba_3N_2$:8.627, EuN:0.130, $Si_3N_4$:16.667, and $SiO_2$:1 and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of $1\times10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 2000° C. at a rate of 500° C. per hour, and then the temperature was maintained for two (2) hours.

A synthesized compound was observed by means of an optical microscope and a crystal particle having a size of 10 µm was collected out of the synthesized compound. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Ba, Eu, and Si elements was confirmed, and it was confirmed that the composition was the same as designed.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

The crystal structure of the crystal was determined using single crystal structure analysis software (APEX2 made by Bruker AXS Inc.) from the results of X-ray diffraction measurement. The crystal structure thus-obtained was the same as that of the present crystal. Here, Eu and Ba exist in the equivalent atom positions with a certain ratio, and oxygen and nitrogen exist in the equivalent atom positions with a certain ratio, such that the composition rates of the crystal are determined by averaging their fractions as a whole.

Next, a collected crystal particle was set into an optical microscope and emission spectra were measured by the microspectroscopic method as an ultraviolet ray of 360 nm was irradiated thereon. An Array Spectrometer MCPD-9800 made by OTSUKA ELECTRONICS CO., LTD. was employed as the spectroscope. The measurements were performed in accordance with the method as described in Naoto Hirosaki, et al., Chemistry of Materials, vol 26, pp. 4280-4288. An emission spectrum is shown in FIG. 3.

Figure 3:
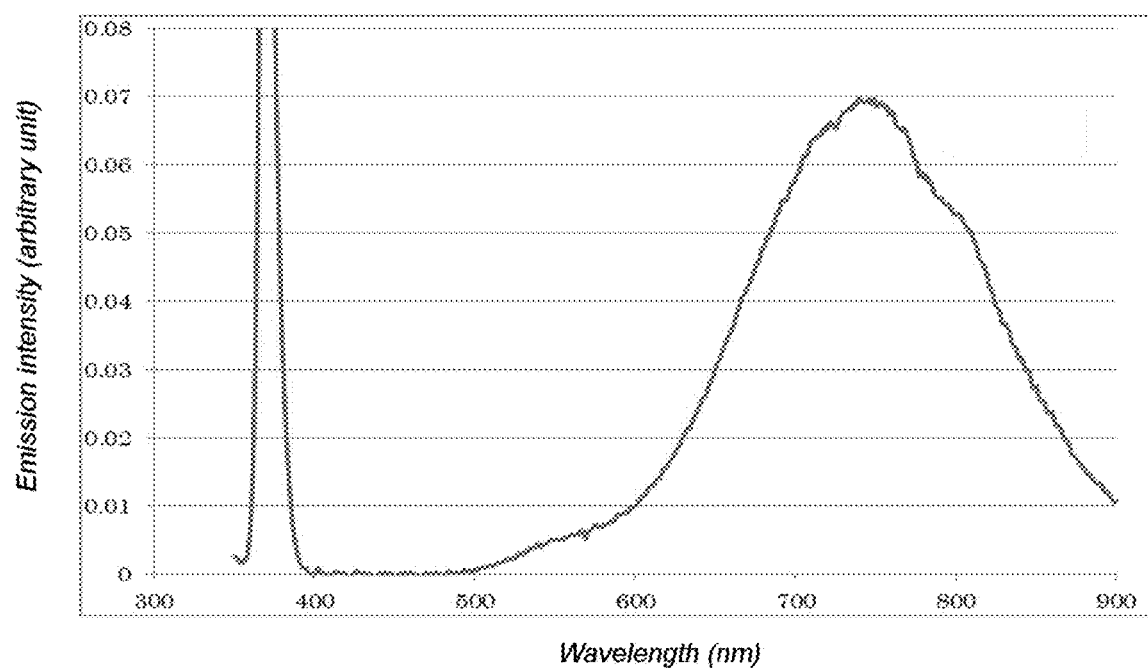
FIG. 3 shows a diagram depicting an emission spectrum of a phosphor synthesized in Example 1.

FIG. 3 shows a diagram showing an emission spectrum of the product of Example 1.

It was found that the product of Example 1 was a phosphor being excited by an ultraviolet ray having a wavelength of 360 nm and emitting light having a peak in a red and infrared range that is 630 nm or longer. In detail, the phosphor of Example 1 was excited by the ultraviolet ray having the wavelength of 360 nm and emitted light having the peak wavelength of 750 nm in the infrared range.

Examples 2-8: Phosphors

Using the same raw material powders as those of Example 1, they were mixed in accordance with each of the compositions as shown in Table 2 and $(Ba, Eu)_{26}Si_{51}(O, N)_{86}$ phosphors were synthesized by the same manufacturing method as that of Example 1. Crystal particles were collected from the synthesized materials and their crystal phases were identified with the single crystal X-ray diffractometer such that it was confirmed that they had the identical crystal structure to that of $Ba_{26}Si_{51}O_2N_{84}$ as shown in Table 1. The emission spectrum was measured by the microspectroscopic method while each of the crystal particles was irradiated with light of 360 nm. As shown in Table 2, the emission peak wavelengths indicated they emitted red to near-infrared light.

TABLE 2

Lists of design compositions and emission peak wavelengths of Examples 2-8

| Exam-ples | Design composition (Atom ratio) | | | | | Mixture composition (Mole ratio) | | | | Ba a | Eu m | Si d | E e | O, N x | O x1 | N x2 | Emission peak wavelength (nm) |
|---|---|---|---|---|---|---|---|---|---|---|---|---|---|---|---|---|---|
| | Ba | Eu | Si | O | N | Ba3N2 | EuN | Si3N4 | SiO2 | | | | | | | | |
| 2 | 25.974 | 0.026 | 51 | 2 | 84 | 8.658 | 0.026 | 16.667 | 1 | 0.159 | 0.0002 | 0.313 | 0 | 0.528 | 0.012 | 0.515 | 753 |
| 3 | 25.87 | 0.13 | 51 | 2 | 84 | 8.623 | 0.130 | 16.667 | 1 | 0.159 | 0.0008 | 0.313 | 0 | 0.528 | 0.012 | 0.515 | 750 |
| 4 | 25.74 | 0.26 | 51 | 2 | 84 | 8.580 | 0.260 | 16.667 | 1 | 0.158 | 0.0016 | 0.313 | 0 | 0.528 | 0.012 | 0.515 | 797 |
| 5 | 24.95 | 1.04 | 51 | 2 | 84 | 8.320 | 1.040 | 16.667 | 1 | 0.153 | 0.0064 | 0.313 | 0 | 0.528 | 0.012 | 0.515 | 758 |
| 6 | 23.4 | 2.6 | 51 | 2 | 84 | 7.800 | 2.600 | 16.667 | 1 | 0.144 | 0.0160 | 0.313 | 0 | 0.528 | 0.012 | 0.515 | 764 |
| 7 | 20.8 | 5.2 | 51 | 2 | 84 | 6.933 | 5.200 | 16.667 | 1 | 0.128 | 0.0319 | 0.313 | 0 | 0.528 | 0.012 | 0.515 | 800 |
| 8 | 15.6 | 10.4 | 51 | 2 | 84 | 5.200 | 10.400 | 16.667 | 1 | 0.096 | 0.0638 | 0.313 | 0 | 0.528 | 0.012 | 0.515 | 752 |

Examples 9-20: Phosphors

Using the same raw material powders as those of Example 1, they were mixed in accordance with each of the compositions as shown in Table 3 and $(A, M)_{26}(D, E)_{51}X_{86}$ phosphors were synthesized by the same manufacturing method as that of Example 1. There are some compositions in Table 3 shifting slightly from those of $(A, M)_{26}(D, E)_{51}X_{86}$, but, in such a case, they are mixtures of the present identical crystal and other phases. Crystal particles were collected from the products and their crystal phases were identified with the single crystal X-ray diffractometer such that it was confirmed that substance having the identical crystal structure to that of $Ba_{26}Si_{51}O_2N_{84}$ as shown in Table 1 was included. The emission spectrum was measured by the microspectroscopic method while each of the crystal particles was irradiated with light of 360 nm. As shown in Table 3, the emission peak wavelengths indicated they emitted red to near-infrared light.

TABLE 3

Lists of design compositions and emission peak wavelengths of Examples 9-20

| Exam-ples | Design composition (Atom ratio) | | | | | Mixture composition (Mole ratio) | | | | Ba (nm) | Eu m | Si d | E e | O, N x | O x1 | N x2 | Emission peak wavelength (nm) |
|---|---|---|---|---|---|---|---|---|---|---|---|---|---|---|---|---|---|
| | Ba | Eu | Si | O | N | Ba3N2 | EuN | Si3N4 | SiO2 | | | | | | | | |
| 9 | 21.658 | 0.52 | 51 | 2 | 84 | 7.219 | 0.52 | 16.667 | 1 | 0.136 | 0.0033 | 0.320 | 0 | 0.540 | 0.013 | 0.528 | 758 |
| 10 | 22.932 | 0.52 | 51 | 2 | 84 | 7.644 | 0.52 | 16.667 | 1 | 0.143 | 0.0032 | 0.318 | 0 | 0.536 | 0.012 | 0.524 | 756 |
| 11 | 24.206 | 0.52 | 51 | 2 | 84 | 8.069 | 0.52 | 16.667 | 1 | 0.150 | 0.0032 | 0.315 | 0 | 0.532 | 0.012 | 0.519 | 755 |
| 12 | 25.48 | 0.52 | 51 | 2 | 84 | 8.493 | 0.52 | 16.667 | 1 | 0.156 | 0.0032 | 0.313 | 0 | 0.528 | 0.012 | 0.515 | 757 |
| 13 | 26.754 | 0.52 | 51 | 2 | 84 | 8.918 | 0.52 | 16.667 | 1 | 0.163 | 0.0032 | 0.310 | 0 | 0.524 | 0.012 | 0.511 | 755 |
| 14 | 28.028 | 0.52 | 51 | 2 | 84 | 9.343 | 0.52 | 16.667 | 1 | 0.169 | 0.0031 | 0.308 | 0 | 0.519 | 0.012 | 0.507 | 769 |
| 15 | 30.576 | 0.52 | 51 | 2 | 84 | 10.192 | 0.52 | 16.667 | 1 | 0.182 | 0.0031 | 0.303 | 0 | 0.512 | 0.012 | 0.500 | 630 |
| 16 | 25.48 | 0.52 | 51 | 0 | 84 | 8.493 | 0.52 | 17 | 0 | 0.158 | 0.0032 | 0.317 | 0 | 0.522 | 0.000 | 0.522 | 764 |
| 17 | 25.48 | 0.52 | 51 | 1 | 84 | 8.493 | 0.52 | 16.833 | 0.5 | 0.157 | 0.0032 | 0.315 | 0 | 0.525 | 0.006 | 0.519 | 754 |
| 18 | 25.48 | 0.52 | 51 | 3 | 84 | 8.493 | 0.52 | 16.5 | 1.5 | 0.155 | 0.0032 | 0.311 | 0 | 0.530 | 0.018 | 0.512 | 761 |
| 19 | 25.48 | 0.52 | 51 | 6 | 84 | 8.493 | 0.52 | 16 | 3 | 0.153 | 0.0031 | 0.305 | 0 | 0.539 | 0.036 | 0.503 | 760 |
| 20 | 25.48 | 0.52 | 51 | 12 | 84 | 8.493 | 0.52 | 15 | 6 | 0.147 | 0.0030 | 0.295 | 0 | 0.555 | 0.069 | 0.486 | 750 |

Examples 21-38: Phosphors

The same raw material powders as those of Example 1; magnesium nitride ($Mg_3N_2$; made by Materion); calcium nitride ($Ca_3N_2$; made by Materion); strontium nitride ($Sr_3N_2$; made by Materion); and aluminum nitride powder with a particle size of specific surface area of 3.3 m²/g and oxygen content of 1.29 wt % (E grade; made by Tokuyama Corporation) were used as appropriate and mixed with each of the compositions as shown in Table 4 and $(A, M)_{26}(D, E)_{51}X_{86}$ phosphors were synthesized by the same manufacturing method as that of Example 1. There are some compositions in Table 4 shifting slightly from those of $(A, M)_{26}(D, E)_{51}X_{86}$, but, in such a case, they are mixtures of the present identical crystal and other phases. Crystal particles were collected from the products and their crystal phases were identified with the single crystal X-ray diffractometer such that it was confirmed that substance having the identical crystal structure to that of $Ba_{26}Si_{51}O_2N_{84}$ as shown in Table 1 was included. The emission spectrum was measured by the microspectroscopic method while each of the crystal particles was irradiated with light of 360 nm such that the measurement showed emission of red to infrared light having a peak wavelength in a range from 630 nm to 850 nm.

TABLE 4

Lists of design compositions of Examples 21-38

| Examples | Design composition (Atom ratio) | | | | | | | | | Mixture composition (Mole ratio) | | | | |
|---|---|---|---|---|---|---|---|---|---|---|---|---|---|---|
| | Eu | Ba | Sr | Ca | Mg | Al | S | O | N | Si3N4 | SO2 | AlN | Mg3N2 | Ca3N2 |
| 21 | 0.1 | 25.9 | | | | | 51 | 2 | 84 | 16 | 1 | 0 | 0 | 0 |
| 22 | 0.25 | 25.75 | | | | | 51 | 2 | 84 | 16 | 1 | 0 | 0 | 0 |
| 23 | 0.5 | 25.5 | | | | | 51 | 2 | 84 | 16 | 1 | 0 | 0 | 0 |
| 24 | 1 | 25 | | | | | 51 | 2 | 84 | 16 | 1 | 0 | 0 | 0 |
| 25 | 2.5 | 23.5 | | | | | 51 | 2 | 84 | 16 | 1 | 0 | 0 | 0 |
| 26 | 5 | 21 | | | | | 51 | 2 | 84 | 16 | 1 | 0 | 0 | 0 |
| 27 | 10 | 16 | | | | | 51 | 2 | 84 | 16 | 1 | 0 | 0 | 0 |
| 28 | 0.25 | 25.75 | | | | 0.5 | 50.5 | 2.5 | 83.5 | 15.583 | 1.25 | 0.5 | 0 | 0 |
| 29 | 0.25 | 25.75 | | | | 1 | 50 | 3 | 83 | 15.167 | 1.5 | 1 | 0 | 0 |
| 30 | 0.25 | 25.75 | | | | 2 | 49 | 4 | 82 | 14.333 | 2 | 2 | 0 | 0 |
| 31 | 0.25 | 25.75 | | | | 4 | 47 | 6 | 80 | 12.667 | 3 | 4 | 0 | 0 |
| 32 | 0.25 | 25.75 | | | | 8 | 43 | 10 | 76 | 9.333 | 5 | 8 | 0 | 0 |
| 33 | 0.25 | 0 | 25.75 | | | | 51 | 2 | 84 | 16 | 1 | 0 | 0 | 0 |
| 34 | 0.25 | 0 | | 25.75 | | | 51 | 2 | 84 | 16 | 1 | 0 | 0 | 8.583 |
| 35 | 0.25 | 0 | | | 25.75 | | 51 | 2 | 84 | 16 | 1 | 0 | 8.583 | 0 |
| 36 | 0.25 | 20.15 | 5.6 | | | | 51 | 2 | 84 | 16 | 1 | 0 | 0 | 0 |
| 37 | 0.25 | 20.15 | | 5.6 | | | 51 | 2 | 84 | 16 | 1 | 0 | 0 | 1.867 |
| 38 | 0.25 | 20.15 | | | 5.6 | | 51 | 2 | 84 | 16 | 1 | 0 | 1.867 | 0 |

| Examples | Mixture composition (Mole ratio) | | | A | Eu | Si | Al | O, N | O | N |
|---|---|---|---|---|---|---|---|---|---|---|
| | Sr3N2 | Ba3N2e | EuN | a | m | d | e | x | x1 | x2 |
| 21 | 0 | 8.633 | 0.1 | 0.159 | 0.0003 | 0.313 | 0 | 0.534 | 0.012 | 0.515 |
| 22 | 0 | 8.583 | 0.25 | 0.158 | 0.0008 | 0.313 | 0 | 0.534 | 0.012 | 0.515 |
| 23 | 0 | 8.5 | 0.5 | 0.156 | 0.0017 | 0.313 | 0 | 0.534 | 0.012 | 0.515 |
| 24 | 0 | 8.333 | 1 | 0.153 | 0.0033 | 0.313 | 0 | 0.534 | 0.012 | 0.515 |
| 25 | 0 | 7.833 | 2.5 | 0.144 | 0.0084 | 0.313 | 0 | 0.534 | 0.012 | 0.515 |
| 26 | 0 | 7 | 5 | 0.129 | 0.0169 | 0.313 | 0 | 0.534 | 0.012 | 0.515 |
| 27 | 0 | 5.333 | 10 | 0.098 | 0.0345 | 0.313 | 0 | 0.534 | 0.012 | 0.515 |
| 28 | 0 | 8.583 | 0.25 | 0.158 | 0.0008 | 0.310 | 0.003 | 0.536 | 0.015 | 0.512 |
| 29 | 0 | 8.583 | 0.25 | 0.158 | 0.0008 | 0.307 | 0.006 | 0.538 | 0.018 | 0.509 |
| 30 | 0 | 8.583 | 0.25 | 0.158 | 0.0008 | 0.301 | 0.012 | 0.541 | 0.025 | 0.503 |
| 31 | 0 | 8.583 | 0.25 | 0.158 | 0.0008 | 0.288 | 0.025 | 0.548 | 0.037 | 0.491 |
| 32 | 0 | 8.583 | 0.25 | 0.158 | 0.0008 | 0.264 | 0.048 | 0.562 | 0.061 | 0.466 |
| 33 | 8.583 | 0 | 0.25 | 0.158 | 0.0008 | 0.313 | 0 | 0.534 | 0.012 | 0.515 |
| 34 | 0 | 0 | 0.25 | 0.158 | 0.0008 | 0.313 | 0 | 0.534 | 0.012 | 0.515 |
| 35 | 0 | 0 | 0.25 | 0.158 | 0.0008 | 0.313 | 0 | 0.534 | 0.012 | 0.515 |
| 36 | 1.867 | 6.717 | 0.25 | 0.158 | 0.0008 | 0.313 | 0 | 0.534 | 0.012 | 0.515 |
| 37 | 0 | 6.717 | 0.25 | 0.158 | 0.0008 | 0.313 | 0 | 0.534 | 0.012 | 0.515 |
| 38 | 0 | 6.717 | 0.25 | 0.158 | 0.0008 | 0.313 | 0 | 0.534 | 0.012 | 0.515 |

Example 39: Light-Emitting Device

Next, in an embodiment of the present invention, a light-emitting device having a phosphor is explained.

Figure 4:
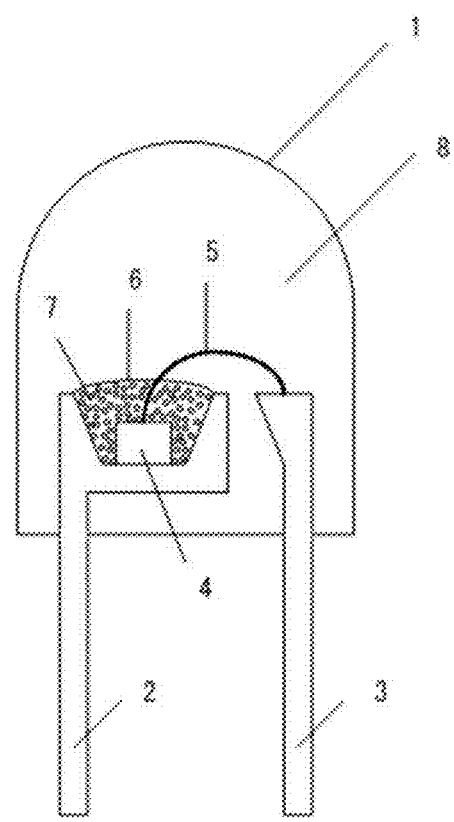
FIG. 4 shows a schematic diagram illustrating an illuminating device (bullet-type of LED illuminating device) according to the embodiment of the present invention.

FIG. 4 shows a schematic diagram illustrating an illuminating device (bullet-type of LED illuminating device) in an embodiment of the present invention.

A bullet-type of white color light-emitting diode lamp (1) was made as shown in FIG. 4. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the light-emitting diode element (4). The first resin (6) in which this phosphor is dispersed is transparent, and covers the entire ultraviolet light-emitting diode element (4). The tip-top portion of the lead wire including the recess, the blue light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In this embodiment, a phosphor powder in which the phosphor made in Example 1, a blue phosphor of JEM:Ce; a green phosphor of β-sialon:Eu; and a red phosphor of $CaAlSiN_3$:Eu were mixed at the weight ratios of 4:4:1:1 was mixed with epoxy resin at the concentration of 35 wt % and an appropriate amount of thus-mixed mixture was dropped with a dispenser to form the first resin (6) in which the phosphor (7) was mixed. The color of the thus-obtained light-emitting device was a white color including emission components from a blue color to infrared. Here, the blue phosphor of JEM:Ce; the green phosphor of β-sialon:Eu; and the red phosphor of $CaAlSiN_3$:Eu were manufactured with reference to Patent Reference 7, Patent Reference 4, and Patent Reference 9, respectively.

Example 40: Light-Emitting Device

Figure 5:
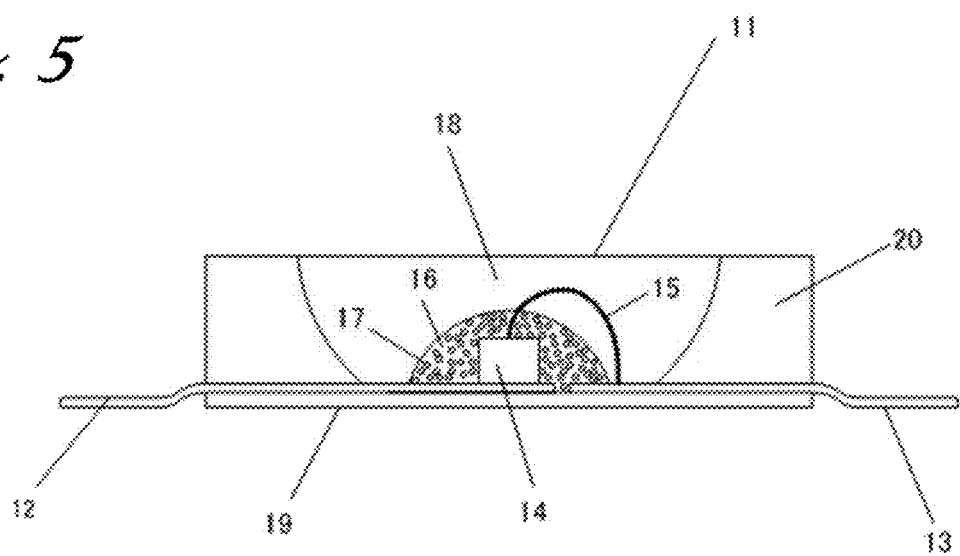
FIG. 5 shows a schematic diagram illustrating an illuminating device (board-mounting-type LED illuminating device) according to the embodiment of present invention.

FIG. 5 shows a schematic diagram illustrating an illuminating device (board-mounting-type of LED illuminating device) in an embodiment of the present invention.

A board-mounting chip-type of light-emitting diode lamp (11) was made as shown in FIG. 5. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected to a gold thin wire (15).

A mixture of the first resin (16) and a mixture phosphor (17) in which a phosphor made in Example 1 and a red phosphor of $CaAlSiN_3$:Eu were mixed by the mass ratio of 1:1 is mounted in the vicinity of the light-emitting diode element. The first resin in which this phosphor is dispersed is transparent, and covers the entire blue color light-emitting diode element (14). Also, a wall surface member (20) having a hole opened at the center portion is fixed to the ceramic board. The wall surface member (20) has the center portion formed as the hole in which the blue light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In this example, the wall surface member (20) is configured with white silicone resin. The hole at the center portion of the wall surface member is formed with a recess as the final shape of the chip-type light-emitting diode lamp, and is filled up with second transparent resin (18) to seal all of the blue light-emitting diode element (14) and the first resin (16) in which the phosphor (17) is dispersed. In this example, the same epoxy resin was used for both the first resin (16) and second resin (18). A red and infrared light-emitting LED was obtained.

INDUSTRIAL APPLICABILITY

In an embodiment of the present invention, a phosphor has different emission characteristics (emission color, excitation characteristics, emission spectra) than those of the conventional phosphor, has a high emission intensity even if combined with an LED excitation source, and is chemically and thermally stable and further the brightness of the phosphor deteriorates only slightly when exposed to the excitation source. The phosphor can be used suitably for a light-emitting device such as a white LED and a white color light-emitting diode; an illuminating device; a backlight emission source for a liquid crystal panel; a lamp for a projector; an infrared lighting device; an infrared light source for an infrared measuring device; and so on. It is expected that the phosphor will be utilized in material design for various kinds of light-emitting devices so as to contribute to the development of the industry.

EXPLANATION OF NUMERALS 1 bullet-type white emission diode lamp
2, 3 lead wire
4 ultraviolet light-emitting diode element
5 gold thin wire
6, 8 resin
7 phosphor
11 board-mounting chip-type of infrared light-emitting diode lamp
12, 13 lead wire
14 blue light-emitting diode element
15 gold thin wire
16, 18 resin
17 phosphor
19 alumina ceramic board
20 wall surface member

What is claimed is:

1. A phosphor comprising inorganic substance including a crystal represented by $A_{26}D_{51}X_{86}$ that includes at least an A element, a D element, and an X element;
    wherein A is at least one kind of element selected from a group consisting of Mg, Ca, Sr, and Ba; and D is Si element, and X is at least one kind of element selected from a group consisting of O, N, and F; and optionally the D element is partially substituted by an E element wherein E is at least one kind of element selected from a group consisting of B, Al, Ga, and In; and wherein the crystal further includes an M element as being solid solved therein wherein M is at least one kind of element selected from a group consisting of Mn, Ce, Pr, Nd, Sm, Eu, Tb, Dy, and Yb.

2. The phosphor according to claim 1 wherein the crystal represented by $A_{26}D_{51}X_{86}$ is $A_{26}D_{51}O_2N_{84}$ and the D element is not substituted by the E element.

3. The phosphor according to claim 1 wherein the crystal represented by $A_{26}D_{51}X_{86}$ has a crystal structure in the cubic crystal system and the lattice constant of a satisfies:

$$1.6 \text{ nm} < a < 1.7 \text{ nm}.$$

4. The phosphor according to claim 1 wherein the crystal represented by $A_{26}D_{51}X_{86}$ is a crystal that belongs to a space group of P-43n wherein "-4" represents 4 overbar and the space group is a 218th space group of International Tables for Crystallography.

5. The phosphor according to claim 1 wherein the inorganic substance has a chemical composition represented by $A_aD_dE_eX_xM_m$ wherein a+d+e+x+m=1 and parameters a, d, e, x, and m satisfy:

$$0.09 \leq a \leq 0.18,$$

$$0.26 \leq d \leq 0.33,$$

$$0 \leq e \leq 0.1,$$

$$0.5 \leq x \leq 0.57, \text{ and}$$

$$0.0001 \leq m \leq 0.07.$$

6. The phosphor according to claim 5 wherein the parameters a, d, e, x, and m satisfy:

$$0.15 \leq a \leq 0.17,$$

$$0.3 \leq d \leq 0.33,$$

$$0 \leq e \leq 0.1,$$

$$0.52 \leq x \leq 0.55, \text{ and}$$

$$0.0001 \leq m \leq 0.05.$$

7. The phosphor according to claim 1 wherein the crystal represented by $A_{26}D_{51}X_{86}$ is $Ba_{26}Si_{51}O_2N_{84}$.

8. The phosphor according to claim 1 wherein the M is Eu; the inorganic substance has a chemical composition represented by $A_aD_dE_eX_xM_m$ wherein a+d+e+x+m=1; and the parameter m of the M element satisfies:

$$0.0001 \leq m \leq 0.05.$$

9. The phosphor according to claim 1 wherein light having a maximum value of an emission peak at a wavelength in a range of 630 nm or longer and 850 nm or shorter is emitted as light having a wavelength of 300 nm or longer and 600 nm or shorter is irradiated.

10. A manufacturing method of a phosphor as defined in claim 1 comprising the step of: firing a raw material mixture, which is a mixture of metallic compounds and is capable of constituting the phosphor by firing, in an inert atmosphere including nitrogen in a temperature range that is 1400° C. or higher and is 2200° C. or lower.

11. The manufacturing method according to claim 10 wherein the mixture of metallic compounds include one or more kinds of compounds including A being selected from a group consisting of nitride, oxynitride, oxide, carbonate, and fluoride that include A wherein A is at least one or more kinds of elements selected from a group consisting of Mg, Ca, Sr, and Ba; one or more kinds of compounds including D being selected from a group consisting of nitride, oxynitride, oxide, carbonate, and fluoride that include D wherein D is Si element; if necessary, one or more kinds of compounds including E being selected from a group consisting of nitride, oxynitride, oxide, carbonate, and fluoride that include E wherein E is at least one or more kinds of elements selected from a group consisting of B, Al, Ga, and In+; and one or more kinds of compounds including M being selected from a group consisting of nitride, oxynitride, oxide, carbonate, and fluoride that include M wherein M is at least one or more kinds of elements selected from a group consisting of Mn, Ce, Pr, Nd, Sm, Eu, Tb, Dy, and Yb.

12. A light emitting device comprising: at least a phosphor as defined in claim 1 and an excitation source emitting light having a wavelength in a range of 300 nm or longer and 600 nm or shorter.

13. The light emitting device according to claim 12 wherein the excitation source is a light-emitting diode (LED) or a laser diode (LD).

14. The light emitting device according to claim 12 further comprising: one or more kinds of phosphors emitting light having a maximum value of an emission peak at a wavelength in a range of 400 nm or longer and 760 nm or shorter by irradiating light from the excitation source.

15. The light emitting device according to claim 14 wherein the one or more kinds of phosphors are one or more kinds of phosphors selected from a group consisting of AlN: (Eu, Si), $BaMgAl_{10}O_{17}$:Eu, $SrSi_9Al_{19}ON_{31}$:Eu, $LaSi_9Al_{19}N_{32}$:Eu, α-sialon: Ce, JEM: Ce, β-sialon: Eu, (Ba, Sr, Ca, Mg)$_2$SiO$_4$:Eu, (Ca, Sr, Ba) Si$_2$O$_2$N$_2$:Eu, YAG: Ce, α-sialon:Eu, CaAlSiN$_3$:Ce, La$_3$Si$_6$N$_{11}$:Ce, CaAlSiN$_3$:Eu, (Ca, Sr) AlSiN$_3$:Eu, Ca$_2$Si$_5$N$_8$:Eu, and Sr$_2$Si$_5$N$_8$:Eu.

16. The light emitting device according to claim 12 wherein the light-emitting device is any one of an illuminating device, a backlight emission source for a liquid crystal panel, a lamp for a projector, an infrared lighting device, or a light source for an infrared measuring device.

* * * * *